United States Patent
Bajoria et al.

(10) Patent No.: US 11,716,074 B2
(45) Date of Patent: Aug. 1, 2023

(54) COMPARATOR WITH NEGATIVE CAPACITANCE COMPENSATION

(71) Applicant: NXP B.V., Eindhoven (NL)

(72) Inventors: Shagun Bajoria, Eindhoven (NL); Lucien Johannes Breems, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/455,992

(22) Filed: Jun. 28, 2019

(65) Prior Publication Data
US 2020/0412345 A1     Dec. 31, 2020

(51) Int. Cl.
*H03K 3/0233*     (2006.01)
*H03F 3/45*     (2006.01)
*H03M 3/00*     (2006.01)

(52) U.S. Cl.
CPC ....... *H03K 3/0233* (2013.01); *H03F 3/45264* (2013.01); *H03M 3/43* (2013.01); *H03M 3/464* (2013.01)

(58) Field of Classification Search
CPC .... H03F 3/45264; H03K 3/0233; H03M 3/43; H03M 3/464
See application file for complete search history.

(56) References Cited

U.S. PATENT DOCUMENTS

| | | | | |
|---|---|---|---|---|
| 8,072,363 B2* | 12/2011 | Yu | | H03M 3/408 341/143 |
| 8,339,198 B2* | 12/2012 | Mole | | H03F 3/45493 330/252 |
| 8,872,587 B2* | 10/2014 | Cheeranthodi | | H03F 3/45179 330/254 |
| 8,884,655 B2* | 11/2014 | Mukherjee | | H03F 1/08 327/108 |
| 9,264,056 B2 | 2/2016 | Dai | | |
| 10,536,178 B2* | 1/2020 | Chang | | H04L 25/03019 |
| 2014/0268450 A1* | 9/2014 | Cyrusian | | H03K 3/0375 361/56 |

OTHER PUBLICATIONS

Bolatkale, M., "A 4 GHz Continuous-Time ΔΣ ADC With 70 dB DRand 74 dBFS THD in 125 MHz B", IEEE Journal of Solid-State Circuits, vol. 46, No. 12, Dec. 2011.
Shibata, H., "A DC-to-1GHz Tunable RF ΔΣ ADC Achieving DR = 74dB and BW = 150MHz at f0 = 450MHz Using 550mW", ISSCC 2012/ Session 8 / Delta-Sigma Converters / 8.3.
Walden, R., "Analog-to-Digital Converter Survey and Analysis", IEEE Journal on Selected Areas in Communications, vol. 17, No. 4, Apr. 1999.

(Continued)

*Primary Examiner* — Ryan Johnson
*Assistant Examiner* — Colleen J O Toole

(57) ABSTRACT

A high-speed comparator circuit is provided. The circuit includes an amplifier portion, a latch portion, and a negative capacitance portion. The amplifier portion includes an input coupled to receive an analog signal and an output. The latch portion is coupled to the amplifier portion. The latch portion is configured to provide at the output a digital value based on the analog signal. The negative capacitance portion is coupled to the output. The negative capacitance portion is configured to cancel parasitic capacitance coupled at the first output.

20 Claims, 3 Drawing Sheets

(56) References Cited

OTHER PUBLICATIONS

"Gyrator"; https://en.wikipedia.org/wiki/Gyrator; downloaded Jun. 27, 2019.
Behzad, R., "Design of Integrated Circuits for Optical Communications Second Edition", pp. 174-179, Aug. 21, 2012.
Mrkovic, B., "The Simple CMOS Negative Capacitance with Improved Frequency Response", MIPRO, May 21-25, 2012.
Muratore, D., "Very High-Speed CMOS Comparators for Multi-GS/s AD Converters", 11th Conference on PhD Research in Microelectronics and Electronics, IEEE, Jun. 29, 2015.

* cited by examiner

COMPARATOR WITH NEGATIVE CAPACITANCE COMPENSATION

BACKGROUND

Field

This disclosure relates generally to electronic circuits, and more specifically, to a comparator with negative capacitance compensation.

Related Art

Today, many integrated circuit (IC) and system-on-a-chip (SoC) devices for applications such as analog and digital radio, base station, radar, etc. require high speed, high accuracy, high linearity, and large bandwidth analog-to-digital converters (ADCs). A sigma-delta modulator is considered having a suitable architecture for such ADCs as it satisfies many of these challenging requirements. However, the sigma-delta modulator has limitations when operated at very high frequencies (e.g., greater than 5 GHz) necessary for these applications.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a high-speed comparator including negative capacitance circuitry. By incorporating negative capacitance circuitry to cancel output parasitic capacitance of the comparator, shorter latching access times can be realized. With shorter latching access time, the comparator can be configured to operate at higher frequencies. Greater throughput can be achieved by processing samples with the comparator operating at higher frequencies.

Figure 1:
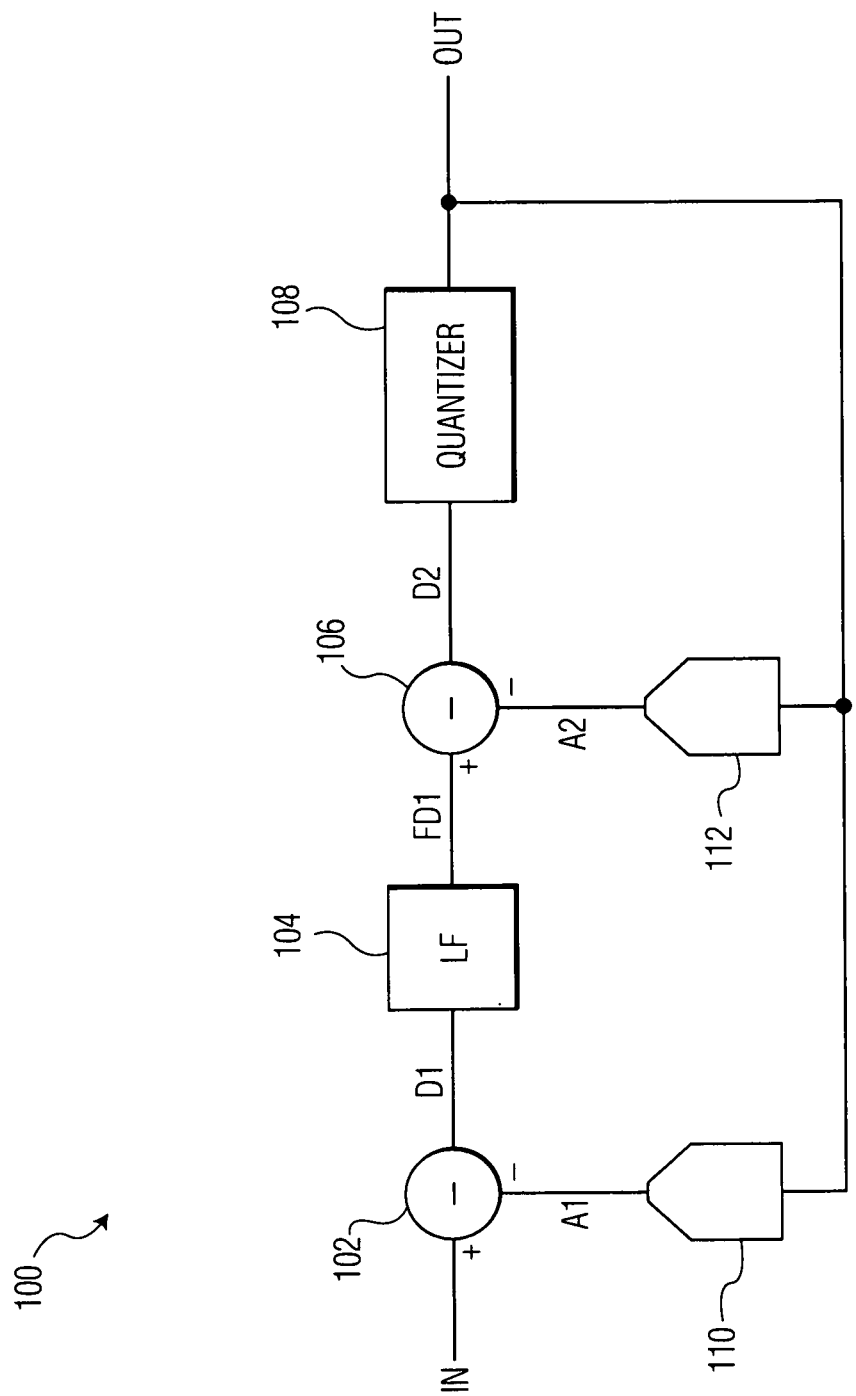
FIG. 1 illustrates, in simplified block diagram form, an example sigma-delta modulator in accordance with an embodiment.

FIG. 1 illustrates, in simplified block diagram form, an example sigma-delta modulator 100 in accordance with an embodiment. Modulator 100 includes an input labeled IN for receiving a differential input signal and an output labeled OUT for providing a digital differential output signal corresponding to the sampled analog signal. In this example, modulator 100 includes summing circuits 102 and 106, a loop filter circuit (LF) 104, a quantizer circuit 108, and digital-to-analog converter (DAC) circuits 110 and 112. In this embodiment, quantizer 108 may be implemented as a single-bit quantizer and thus referred to as a comparator coupled to a memory element. The memory element is configured and arranged for storing output data of the comparator which may be subsequently processed by DAC circuits 110 and 112.

First summing circuit 102 includes a first input coupled to receive the analog signal (e.g., differential signal) and an output coupled to an input of loop filter 104 at node labeled D1. An output of loop filter 104 is coupled to a first input of second summing circuit 106 at node labeled FD1 and an output of second summing circuit 106 is coupled to an input of quantizer 108 at node labeled D2. An output of quantizer 108 is coupled to inputs of DACs 110 and 112 and provides the OUT digital value corresponding to the sampled analog signal. An output of DAC 110 is coupled to a second input of summing circuit 102 at node A1 and an output of DAC 112 is coupled to a second input of summing circuit 106 at node A2. A first feedback loop includes DAC 110 and summing circuit 102 and a second feedback loop includes DAC 112 and summing circuit 106.

In this embodiment, summing circuit 102 generates a first difference signal D1 by subtracting an analog output signal A1 of DAC 110 from the analog input signal IN. The analog signal A1 corresponds to the digital value OUT received at the DAC 110 input. Loop filter 104 generates a filtered signal FD1 based on the received first difference signal D1. Summing circuit 106 generates a second difference signal D2 by subtracting an analog output signal A2 of DAC 112 from the received signal FD1. The analog signal A2 corresponds to the digital value OUT received at the DAC 112 input. In this embodiment, DAC 112 is included to form as an excess loop (ELD) compensation path to further stabilize the overall feedback loop. Quantizer 108 generates the digital value OUT based on the received signal D2. In this embodiment, the digital value OUT includes a complementary digital signal pair, each signal of the pair may be any of a logic high (e.g., logic one) and a logic low (e.g., logic zero), and DACs 110 and 112 may be characterized as one-bit DACs.

Figure 2:
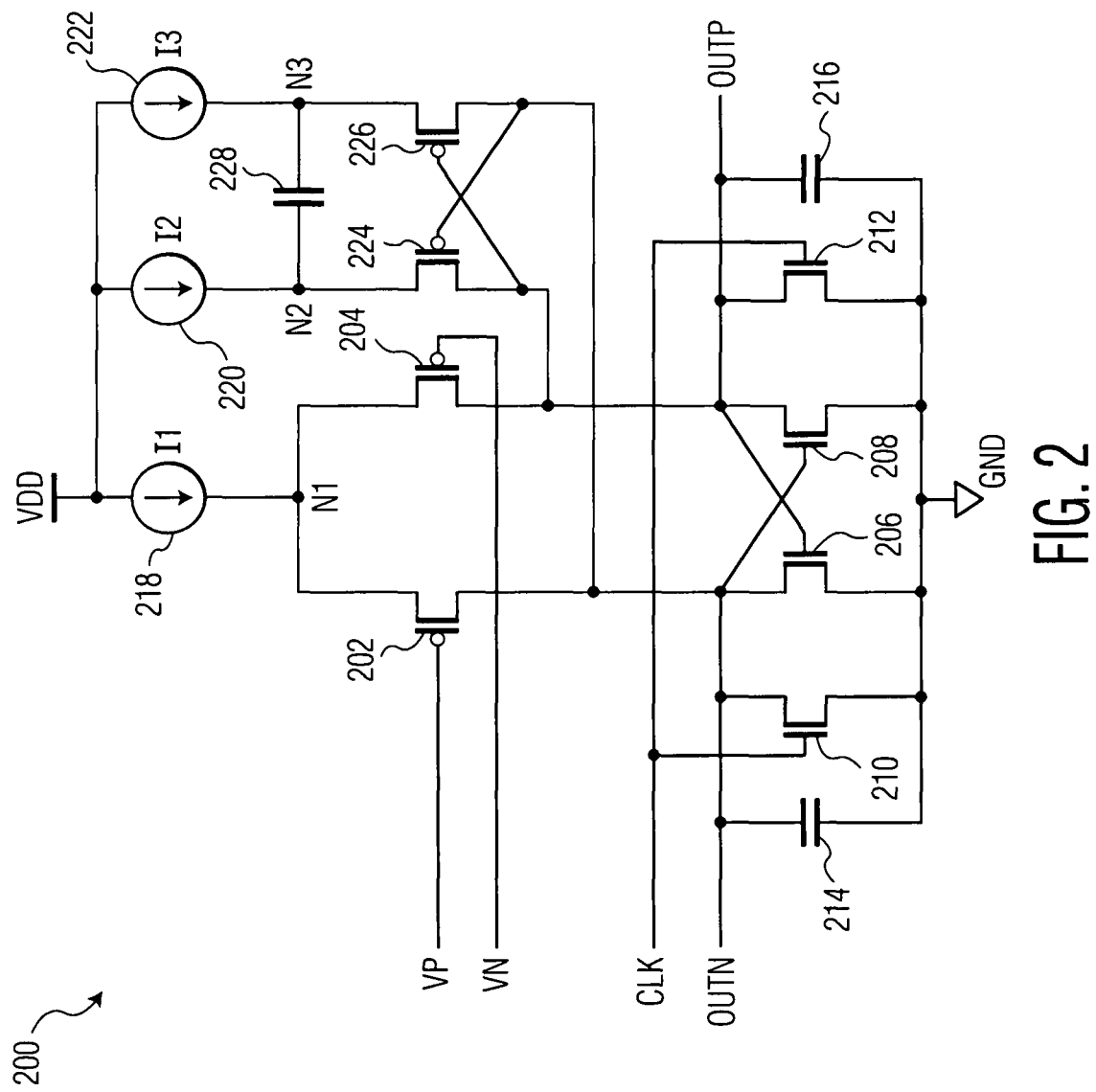
FIG. 2 illustrates, in simplified schematic diagram form, an example implementation of a comparator included in quantizer 108 of FIG. 1 in accordance with an embodiment.

FIG. 2 illustrates, in simplified schematic diagram form, an example implementation of comparator 200 included in the quantizer 108 of modulator 100 in accordance with an embodiment. In this embodiment, comparator 200 may be characterized as a differential single-bit comparator having an integrated latch circuit (e.g., memory element). Comparator 200 includes inputs labeled VP and VN for receiving a differential signal, an input labeled CLK for receiving a control clock signal, a first output labeled OUTP for providing a digital signal corresponding to the received differential signal, and a second output labeled OUTN for providing a complementary (e.g., inverse) digital signal corresponding to the received differential signal. In this example, comparator 200 includes an amplifier portion formed by P-channel transistors 202-204 and current source 218, a latch and reset portion formed by N-channel transistors 206-212, and negative capacitance portion formed by P-channel transistors 224-226, capacitor 228, and current sources 220-222. Capacitors 214-216 represent parasitic capacitances coupled at OUTN and OUTP outputs.

The amplifier portion includes transistors 202-204 and current source 218. The amplifier portion is coupled to receive the differential signal at control electrodes of transistor 202 and transistor 204 respectively. A first current electrode of transistor 202 is coupled to a first current electrode of transistor 204 and a first terminal of current source 218 at node labeled N1. A second current electrode of transistor 202 is coupled at output OUTN and a second current electrode of transistor 204 is coupled at output OUTP. A second terminal of current source 218 is coupled to a first voltage supply terminal labeled VDD. In this embodiment, current source 218 is configured to provide a current I1. In this embodiment, a normal operating voltage is supplied at the VDD supply terminal, and transistors 202 and 204 are formed to have substantially similar size parameters (e.g., width and length values) as each other.

The latch and reset portion includes transistors 206-212 and is coupled to the amplifier portion at OUTN and OUTP outputs. In this embodiment, transistors 206 and 208 are cross-coupled and configured to form a latching circuit with transistors 206 and 208 having substantially similar size parameters as each other. A first current electrode of transistor 206 is coupled at output OUTN, a control electrode of transistor 206 is coupled at output OUTP, and a second current electrode of transistor 206 is coupled to a second voltage supply terminal labeled GND. In this embodiment, a ground voltage (e.g., 0 volts) is supplied at the GND supply terminal. A first current electrode of transistor 208 is coupled at output OUTP, a control electrode of transistor 208 is coupled at output OUTN, and a second current electrode of transistor 208 is coupled at the GND supply terminal.

Transistors 210 and 212 are configured to form a reset circuit such that a first state (e.g., logic high) of the CLK control signal causes the latching circuit to reset in this embodiment. A first current electrode of transistor 210 is coupled at output OUTN, a control electrode of transistor 210 is coupled to receive the CLK control signal, and a second current electrode of transistor 210 is coupled at the GND supply terminal. A first current electrode of transistor 212 is coupled at output OUTP, a control electrode of transistor 212 is coupled to receive the CLK control signal, and a second current electrode of transistor 212 is coupled at the GND supply terminal. In this embodiment, when the CLK control signal is at a second state (e.g., logic low), the reset circuit is inactive allowing the latching circuit to sense a voltage difference (e.g., across outputs OUTN and OUTP) and latch accordingly.

Capacitors 214 and 216 depicting parasitic capacitances coupled at OUTN and OUTP outputs are shown for illustrative purposes. A first terminal of capacitor 214 is coupled at output OUTN, a first terminal of capacitor 216 is coupled at output OUTP, and second terminals of capacitors 214 and 216 are coupled at the GND supply terminal. In this embodiment, capacitors 214 and 216 have substantially similar capacitance values as each other.

The negative capacitance portion is coupled to the amplifier portion and the latch portion at outputs OUTN and OUTP. The negative capacitance portion is configured to substantially cancel the parasitic capacitance coupled at output OUTN and output OUTP. The negative capacitance portion includes transistors 224 and 226, capacitor 228, and current sources 220 and 222. In this embodiment, transistors 224 and 226 are configured in a cross-coupled arrangement where transistors 224 and 226 have substantially similar size parameters as each other. A first current electrode of transistor 224 is coupled at output OUTP, a control electrode of transistor 224 is coupled at output OUTN, and a second current electrode of transistor 224 is coupled to a first terminal of capacitor 228 and a first terminal of current source 220 at node labeled N2. A first current electrode of transistor 226 is coupled at output OUTN, a control electrode of transistor 226 is coupled at output OUTP, and a second current electrode of transistor 226 is coupled to a second terminal of capacitor 228 and a first terminal of current source 222 at node labeled N3. A second terminal of current source 220 and a second terminal of current source 222 are coupled at the VDD supply terminal. In this embodiment, current source 220 is configured to provide a current I2 substantially one-half of current I1, and current source 222 is configured to provide a current I3 substantially equal to current I2. In this embodiment, capacitor 228 is configured to have a capacitance substantially equal to the parasitic capacitance coupled at each of outputs OUTN and OUTP.

Figure 3:
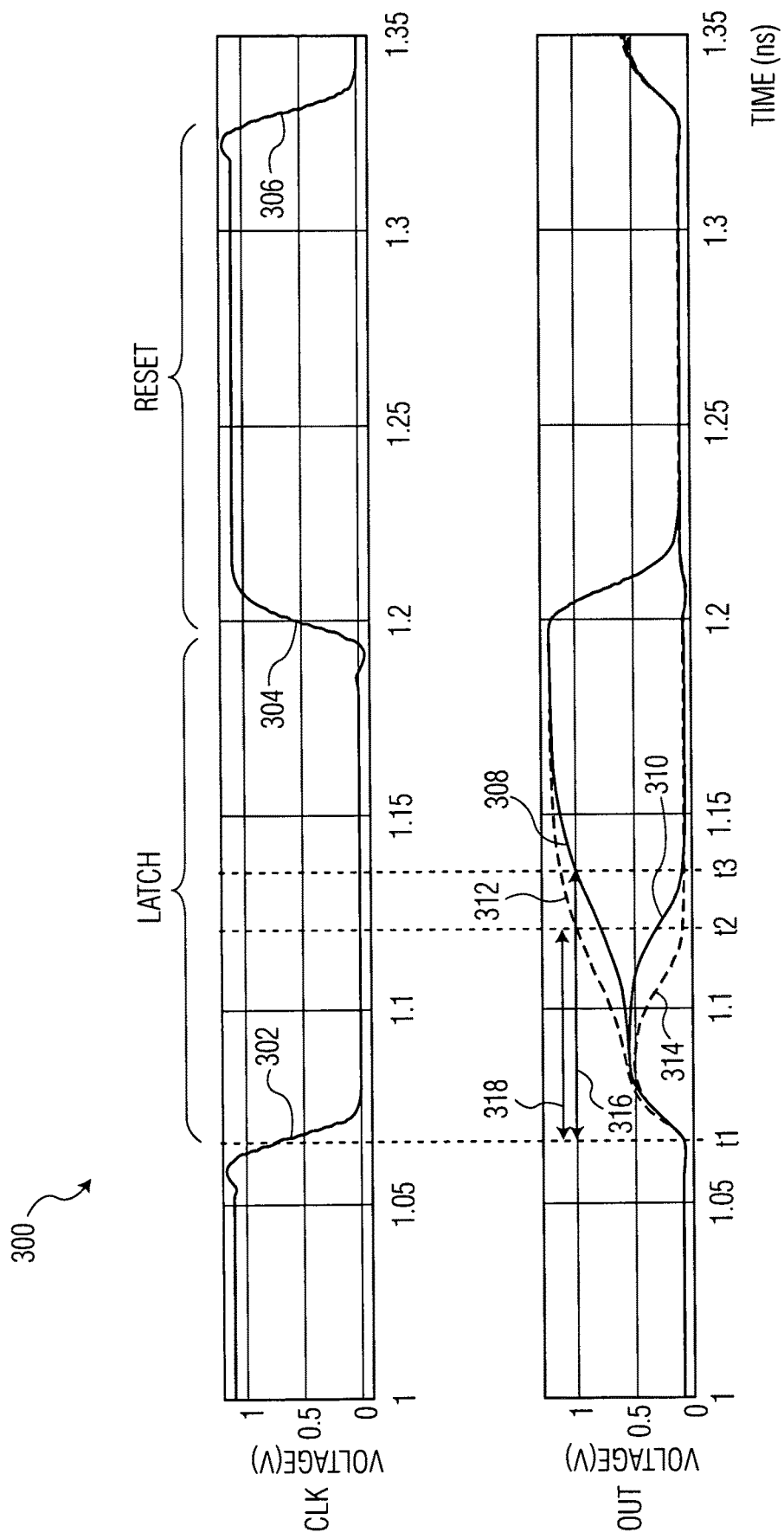
FIG. 3 illustrates, in plot diagram form, an example simulation result of the comparator included in quantizer 108 of FIG. 1 in accordance with an embodiment.

FIG. 3 illustrates, in plot diagram form, an example simulation result of the comparator 200 included in quantizer 108 of modulator 100 in accordance with an embodiment. The plot diagram 300 includes CLK control signal timing and corresponding differential output signal OUT (e.g., OUTN and OUTP) simulation response waveforms. The CLK and OUT waveforms are shown with time values in nanoseconds (ns) on the X-axis and voltage values in volts (V) on the Y-axes. The CLK waveform includes signal transitions 302-306 which delineate the operational phases (e.g., LATCH and RESET) of quantizer 108. The OUT waveform includes a first differential waveform formed by signals 308 and 310 and a second differential waveform formed by (dashed) signals 312 and 314 depicting simulation results of comparator 200 during normal operation. In this example, the first differential waveform depicts a first simulation result of comparator 200 without using of the negative capacitance circuitry and the second differential waveform depicts a second simulation result overlaying the first simulation result of comparator 200 showing a desired access time improvement by utilizing the negative capacitance circuitry.

At time t1, the comparator 200 enters a LATCH phase as the CLK control signal transitions (302) from a logic high to a logic low. In turn, a voltage difference across the differential inputs (e.g., VP, VN) of comparator 200 causes the latching portion to start latching.

At time t2, signals 312 and 314 of the second differential waveform have reached predetermined thresholds indicative of respective logic high and logic low values. Arrow 318 indicates an access time from time t1 to time t2 for the comparator 200 utilizing the negative capacitance circuitry.

At time t3, signals 308 and 310 of the first differential waveform have reached the predetermined thresholds indicative of respective logic high and logic low values. Arrow 316 indicates an access time from time t1 to time t3 for the comparator 200 without using the negative capacitance circuitry. As depicted in this example, the access time of the comparator 200 utilizing the negative capacitance circuitry is significantly shorter (e.g., ~20%). By having a shorter access time, the comparator 200 can operate at significantly higher frequencies.

The LATCH phase ends and the RESET phase begins as the CLK control signal transitions (304) from the logic low to a logic high at approximately 1.2 ns in this example. The comparator 200 enters the LATCH phase again as the CLK control signal transitions (306) to a logic low. In this example, the CLK control signal is illustrated as a 50% duty cycle signal. In some embodiments, the CLK control signal may be configured having a less than 50% duty cycle, and in other embodiments, the CLK control signal may be configured having a greater than 50% duty cycle.

Generally, there is provided, a circuit including an amplifier portion having a first input coupled to receive a first analog signal and a first output; a latch portion coupled to the amplifier portion, the latch portion configured to provide at the first output a digital value based on the first analog signal; and a negative capacitance portion coupled to the first output, the negative capacitance portion configured to cancel parasitic capacitance coupled at the first output. The negative capacitance portion may further include a first transistor having a first current electrode coupled to the first output, a second transistor having a first current electrode coupled to a control electrode of the first transistor and a control electrode coupled to the first output, and a capacitor having a first terminal coupled to a second current electrode of the first transistor and a second terminal coupled to a second current electrode of the second transistor. The capacitor may have a capacitance value substantially equal to the parasitic capacitance coupled at the first output. The negative capacitance portion may further include a first current source having a first terminal coupled to a first voltage supply terminal and a second terminal coupled to the second current electrode of the first transistor, and a second current source having a first terminal coupled to the first voltage supply terminal and a second terminal coupled to the second current electrode of the second transistor. The amplifier portion may further include a first transistor having a first current electrode, a second current electrode coupled to a second output, and a control electrode coupled to receive the first analog signal, and a second transistor having a first current electrode coupled to the first current electrode of the first transistor, a second current electrode coupled to the first output, and a control electrode coupled to receive a second analog signal, the first analog signal and the second analog signal together comprising a differential signal. The amplifier portion may further include a first current source having a first terminal coupled to a first voltage supply terminal and a second terminal coupled to the first current electrodes of the first and second transistors. The latch portion may further include a third transistor having a first current electrode coupled to the second current electrode of the first transistor at the second output, a second current electrode coupled to a second voltage supply terminal, and a control electrode coupled to the second current electrode of the second transistor at the first output, and a fourth transistor having a first current electrode coupled to the second current electrode of the second transistor, a second current electrode couple to the second voltage supply terminal, and a control electrode coupled to the second current electrode of the first transistor. The circuit may further include a first digital-to-analog converter (DAC) having an input coupled to the first output, an output of the DAC coupled to provide a second analog signal representative of the digital value. The circuit may further include a summing circuit having a first input coupled to receive an input signal, a second input for receiving the second analog signal, and an output coupled to provide a first difference signal generated by subtracting the second analog signal from the input signal.

In another embodiment, there is provided, a circuit including an amplifier portion having a first input coupled to receive a first analog signal and a first output, the amplifier portion coupled between a first voltage supply terminal and the first output; a latch portion coupled to the amplifier portion at the first output, the latch portion configured to provide a digital value based on the first analog signal; and a negative capacitance portion coupled to the amplifier portion and the latch portion at the first output, the negative capacitance portion configured to cancel parasitic capacitance coupled at the first output. The negative capacitance portion may further include a first transistor coupled between the first voltage supply terminal and the first output, the first transistor having a first current electrode coupled to the first output, a second transistor having a first current electrode coupled to a control electrode of the first transistor and a control electrode coupled to the first current electrode of the first transistor, and a capacitor having a first terminal coupled to a second current electrode of the first transistor and a second terminal coupled to a second current electrode of the second transistor, the capacitor having a capacitance value substantially equal to the parasitic capacitance coupled at the first output. The negative capacitance portion may further include a first current source having a first terminal coupled to the first voltage supply terminal and a second terminal coupled to the second current electrode of the first transistor, and a second current source having a first terminal coupled to the first voltage supply terminal and a second terminal coupled to the second current electrode of the second transistor. The amplifier portion may further include a third current source coupled to the first voltage supply terminal, a third transistor having a first current electrode coupled to the third current source and a control electrode coupled to receive the first analog signal, and a fourth transistor having a first current electrode coupled to the first current source, a second current electrode coupled to the first output, and a control electrode coupled to receive a second analog signal, the first analog signal and the second analog signal together comprising a differential signal. The third current source may be configured to source an amount of current substantially equal to the sum of current sourced by the first current source and the second current source. The circuit may further include a first digital-to-analog converter (DAC) having an input coupled to the first output, an output of the DAC coupled to provide a second analog signal representative of the digital value. The circuit may further include a summing circuit having a first input coupled to receive an input signal, a second input for receiving the second analog signal, and an output coupled to the first input of the amplifier portion. The summing circuit may be configured to provide at the output a first difference signal generated by subtracting the second analog signal from the input signal.

In yet another embodiment, there is provided, a circuit including an amplifier portion including: a first transistor having a first current electrode, a second current electrode coupled to a first output, and a control electrode coupled to receive a first analog signal, and a second transistor having a first current electrode coupled to the first current electrode of the first transistor, a second current electrode coupled to a second output, and a control electrode coupled to receive a second analog signal, the first analog signal and the second analog signal together comprising a differential signal; a latch portion coupled to the amplifier portion, the latch portion including: a third transistor having a first current electrode coupled at the second output and a control electrode coupled at the first output, and a fourth transistor having a first current electrode coupled at the first output and a control electrode coupled at the second output; and a negative capacitance portion coupled to the amplifier portion and the latch portion, the negative capacitance portion including: a fifth transistor having a first current electrode coupled at the first output and a control electrode coupled at the second output, a sixth transistor having a first current electrode coupled at the second output and a control electrode coupled at the first output, and a capacitor having a first terminal coupled to a second current electrode of the first transistor and a second terminal coupled to a second current electrode of the second transistor. The capacitor may have a capacitance value substantially equal to parasitic capacitance coupled at the first output or the second output. The circuit may further include a seventh transistor having a first current electrode coupled at the second output and a control electrode coupled to receive a control signal, and an eighth transistor having a first current electrode coupled at the first output and a control electrode coupled to receive the control signal, wherein the control signal at first logic state causes the seventh and eighth transistors to conduct and resets the latch portion.

By now it should be appreciated that there has been provided, a quantizer configured to cancel output parasitic capacitance. By incorporating negative capacitance circuitry to cancel the output parasitic capacitance of the quantizer, shorter latching access times can be realized. With shorter latching access time, the quantizer can be configured to operate at higher frequencies. Greater throughput can be achieved by processing samples with the quantizer operating at higher frequencies.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
    an amplifier portion coupled to a first current source and having a first input coupled to receive a first analog signal and a first output, wherein the first current source is configured to generate a first current;
    a latch portion coupled to the amplifier portion, the latch portion configured to provide at the first output a digital value based on the first analog signal;
    a negative capacitance portion coupled to the first output and a second current source, the negative capacitance portion configured to cancel parasitic capacitance coupled at the first output, wherein the second current source is configured to generate a second current substantially one-half of the first current; and
    a first digital-to-analog converter (DAC) having an input coupled to the first output in a first feedback loop, an output of the DAC coupled to provide a second analog signal representative of the digital value.

2. The circuit of claim 1, wherein the negative capacitance portion further comprises:
    a first transistor having a first current electrode coupled to the first output;
    a second transistor having a first current electrode coupled to a control electrode of the first transistor and a control electrode coupled to the first output; and
    a capacitor having a first terminal coupled to a second current electrode of the first transistor and a second terminal coupled to a second current electrode of the second transistor.

3. The circuit of claim 2, wherein the capacitor has a capacitance value substantially equal to the parasitic capacitance coupled at the first output.

4. The circuit of claim 2, wherein the negative capacitance portion further comprises:
    the second current source, the second current source having a first terminal coupled to a first voltage supply terminal and a second terminal coupled to the second current electrode of the first transistor; and
    a third current source having a first terminal coupled to the first voltage supply terminal and a second terminal coupled to the second current electrode of the second transistor.

5. The circuit of claim 1, wherein the amplifier portion further comprises:
    a first transistor having a first current electrode, a second current electrode coupled to a second output, and a control electrode coupled to receive the first analog signal; and
    a second transistor having a first current electrode coupled to the first current electrode of the first transistor, a second current electrode coupled to the first output, and a control electrode coupled to receive a second analog signal, the first analog signal and the second analog signal together comprising a differential signal.

6. The circuit of claim 5, wherein the amplifier portion further comprises the first current source, the first current source having a first terminal coupled to a first voltage supply terminal and a second terminal coupled to the first current electrodes of the first and second transistors.

7. The circuit of claim 5, wherein the latch portion further comprises:
    a third transistor having a first current electrode coupled to the second current electrode of the first transistor at the second output, a second current electrode coupled to a second voltage supply terminal, and a control electrode coupled to the second current electrode of the second transistor at the first output; and
    a fourth transistor having a first current electrode coupled to the second current electrode of the second transistor, a second current electrode couple to the second voltage supply terminal, and a control electrode coupled to the second current electrode of the first transistor.

8. The circuit of claim 1, further comprising a summing circuit having a first input coupled to receive an input signal, a second input for receiving the second analog signal, and an output coupled to provide a first difference signal generated by subtracting the second analog signal from the input signal.

9. A circuit comprising:
    an amplifier portion having a first input coupled to receive a first analog signal and a first output, the amplifier portion coupled between a first voltage supply terminal and the first output;

a first current source coupled to the first voltage supply terminal and configured to generate a first current for the amplifier portion;

a latch portion coupled to the amplifier portion at the first output, the latch portion configured to provide a digital value based on the first analog signal;

a negative capacitance portion coupled to the amplifier portion and the latch portion at the first output, the negative capacitance portion configured to cancel parasitic capacitance coupled at the first output;

a second current source coupled to the first voltage supply terminal and configured to generate a second current substantially one-half of the first current for the negative capacitance portion; and a first digital-to-analog converter (DAC) having an input coupled to the first output in a first feedback loop, an output of the DAC coupled to provide a second analog signal representative of the digital value.

10. The circuit of claim 9, wherein the negative capacitance portion further comprises:

a first transistor coupled between the first voltage supply terminal and the first output, the first transistor having a first current electrode coupled to the first output;

a second transistor having a first current electrode coupled to a control electrode of the first transistor and a control electrode coupled to the first current electrode of the first transistor; and a capacitor having a first terminal coupled to a second current electrode of the first transistor and a second terminal coupled to a second current electrode of the second transistor, the capacitor having a capacitance value substantially equal to the parasitic capacitance coupled at the first output.

11. The circuit of claim 10, wherein:

the second current source includes a first terminal coupled to the first voltage supply terminal and a second terminal coupled to the second current electrode of the first transistor.

12. The circuit of claim 11, wherein the amplifier portion further comprises:

a third transistor having a first current electrode coupled to the first current source and a control electrode coupled to receive the first analog signal; and a fourth transistor having a first current electrode coupled to the first current source, a second current electrode coupled to the first output, and a control electrode coupled to receive a second analog signal, the first analog signal and the second analog signal together comprising a differential signal.

13. The circuit of claim 9, further comprising a second digital-to-analog converter (DAC) having an input coupled to the first output in a second feedback loop, an output of the second DAC coupled to provide a third analog signal representative of the digital value.

14. The circuit of claim 9, further comprising a summing circuit having a first input coupled to receive an input signal, a second input for receiving the second analog signal, and an output coupled to the first input of the amplifier portion.

15. The circuit of claim 14, wherein the summing circuit is configured to provide at the output a first difference signal generated by subtracting the second analog signal from the input signal.

16. A circuit comprising:
an amplifier portion comprising:
a first transistor having a first current electrode, a second current electrode coupled to a first output, and a control electrode coupled to receive a first analog signal, and
a second transistor having a first current electrode coupled to the first current electrode of the first transistor, a second current electrode coupled to a second output, and a control electrode coupled to receive a second analog signal, the first analog signal and the second analog signal together comprising a differential signal;
a first current source having a first terminal coupled to a first voltage supply terminal and a second terminal coupled to the first current electrode of the first and second transistors, the first current source configured to generate a first current;
a latch portion coupled to the amplifier portion, the latch portion comprising:
a third transistor having a first current electrode coupled at the second output and a control electrode coupled at the first output, and
a fourth transistor having a first current electrode coupled at the first output and a control electrode coupled at the second output;
a negative capacitance portion coupled to the amplifier portion and the latch portion, the negative capacitance portion comprising:
a fifth transistor having a first current electrode coupled at the first output and a control electrode coupled at the second output,
a sixth transistor having a first current electrode coupled at the second output and a control electrode coupled at the first output,
a capacitor having a first terminal coupled to a second current electrode of the first transistor and a second terminal coupled to a second current electrode of the second transistor; and
a second current source having a first terminal coupled to the first voltage supply terminal and a second terminal coupled to the second current electrode of the fifth transistor, the second current source configured to generate a second current substantially one-half of the first current; and
a digital-to-analog converter (DAC) having an input coupled to the first output in a first feedback loop, an output of the DAC coupled to provide a second analog signal representative of the digital value.

17. The circuit of claim 16, wherein the capacitor has a capacitance value substantially equal to parasitic capacitance coupled at the first output or the second output.

18. The circuit of claim 16, further comprising:
a seventh transistor having a first current electrode coupled at the second output and a control electrode coupled to receive a control signal; and
an eighth transistor having a first current electrode coupled at the first output and a control electrode coupled to receive the control signal;
wherein the control signal at first logic state causes the seventh and eighth transistors to conduct and resets the latch portion.

19. The circuit of claim 16, further comprising a second digital-to-analog converter (DAC) having an input coupled to the first output in a second feedback loop, an output of the second DAC coupled to provide a third analog signal representative of the digital value.

20. The circuit of claim 16, further comprising a summing circuit having a first input coupled to receive an input signal, a second input for receiving the second analog signal, and an output coupled to provide a first difference signal generated by subtracting the second analog signal from the input signal.

* * * * *